United States Patent
Cai et al.

(10) Patent No.: US 9,323,607 B2
(45) Date of Patent: Apr. 26, 2016

(54) DATA RECOVERY ONCE ECC FAILS TO CORRECT THE DATA

(71) Applicant: Seagate Technology LLC, Cupertino, CA (US)

(72) Inventors: Yu Cai, San Jose, CA (US); Yunxiang Wu, Cupertino, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 120 days.

(21) Appl. No.: 14/273,920

(22) Filed: May 9, 2014

(65) Prior Publication Data

US 2015/0309872 A1 Oct. 29, 2015

Related U.S. Application Data

(60) Provisional application No. 61/985,610, filed on Apr. 29, 2014.

(51) Int. Cl.
*G06F 11/10* (2006.01)
*G11C 29/00* (2006.01)
*G11C 29/04* (2006.01)

(52) U.S. Cl.
CPC ........ *G06F 11/1024* (2013.01); *G06F 11/1076* (2013.01); *G11C 29/04* (2013.01); *G11C 29/72* (2013.01)

(58) Field of Classification Search
CPC ..... G06F 11/1024; G11C 29/72; G11C 29/04
See application file for complete search history.

(56) References Cited

U.S. PATENT DOCUMENTS

| | | | |
|---|---|---|---|
| 6,170,039 B1 * | 1/2001 | Kishida | G06F 11/1666 711/127 |
| 8,245,101 B2 | 8/2012 | Olbrich et al. | 714/753 |
| 8,566,671 B1 * | 10/2013 | Ye | G06F 11/1048 714/764 |
| 8,631,274 B2 | 1/2014 | Frost et al. | 714/6.24 |
| 8,644,066 B2 | 2/2014 | Park | 365/185.03 |
| 8,694,854 B1 | 4/2014 | Dar et al. | 714/763 |
| 8,694,855 B1 | 4/2014 | Micheloni et al. | 714/763 |
| 2008/0282106 A1 * | 11/2008 | Shalvi | G06F 11/1068 714/6.12 |
| 2011/0096601 A1 * | 4/2011 | Gavens | G11C 11/5628 365/185.09 |
| 2011/0271152 A1 * | 11/2011 | Hattori | G06F 11/079 714/53 |
| 2012/0216094 A1 * | 8/2012 | Yoo | G06F 11/1068 714/758 |
| 2012/0260149 A1 | 10/2012 | Chang et al. | 714/773 |
| 2012/0266050 A1 | 10/2012 | Cideciyan et al. | 714/773 |
| 2013/0028021 A1 * | 1/2013 | Sharon | G11C 11/5642 365/185.17 |
| 2013/0031429 A1 | 1/2013 | Sharon et al. | 714/718 |
| 2013/0031430 A1 * | 1/2013 | Sharon | G11C 11/5642 714/719 |
| 2013/0031431 A1 * | 1/2013 | Sharon | G06F 11/1072 714/719 |

(Continued)

*Primary Examiner* — Joseph D Torres
(74) *Attorney, Agent, or Firm* — Christopher P. Maiorana, PC

(57) ABSTRACT

An apparatus comprising a memory and a controller. The memory is configured to process a plurality of read/write operations. The memory comprises a plurality of memory modules each having a size less than a total size of the memory. The controller is configured to salvage data stored in a failed page of the memory determined to exceed a maximum number of errors. The controller copies raw data stored in the failed page. The controller identifies locations of a first type of data cells that fail erase identification. The controller identifies locations of a second type of data cells that have program errors. The controller flips data values in the raw data at the locations of the first type of data cells and the locations of the second type of data cells. The controller is configured to perform error correcting code decoding on the raw data having flipped data values. The controller salvages data stored in the failed page.

20 Claims, 8 Drawing Sheets

(56) References Cited

U.S. PATENT DOCUMENTS

| | | | |
|---|---|---|---|
| 2013/0275832 A1 | 10/2013 | D'Abreu et al. | 714/764 |
| 2013/0283122 A1 | 10/2013 | Anholt et al. | 714/755 |
| 2013/0290793 A1* | 10/2013 | Booth | G11C 29/82 714/54 |
| 2013/0322169 A1* | 12/2013 | Goss | G11C 16/22 365/185.02 |
| 2014/0026013 A1 | 1/2014 | Koseki | 714/764 |
| 2014/0101378 A1 | 4/2014 | Olbrich et al. | 711/103 |
| 2015/0127972 A1* | 5/2015 | Chun | G06F 11/1008 714/6.13 |

\* cited by examiner

DATA RECOVERY ONCE ECC FAILS TO CORRECT THE DATA

This application relates to U.S. Provisional Application No. 61/985,610, filed Apr. 29, 2014, which is hereby incorporated by reference in its entirety.

FIELD OF THE INVENTION

The invention relates to data recovery generally and, more particularly, to a method and/or apparatus for implementing data recovery once ECC fails to correct the data.

BACKGROUND

In NAND flash memory, when the total number of errors in a codeword is larger than the error correction capability of error correcting code (ECC), ECC will fail to correct the stored data. If the data ECC fails to correct is important data (e.g., meta data and/or file system data), the whole solid state drive (SSD) may become unusable. If the SSD becomes unusable then other data may be lost.

It would be desirable to implement data recovery when ECC fails to correct data in a SSD controller and/or drive.

SUMMARY

The invention concerns an apparatus comprising a memory and a controller. The memory is configured to process a plurality of read/write operations. The memory comprises a plurality of memory modules each having a size less than a total size of the memory. The controller is configured to salvage data stored in a failed page of the memory determined to exceed a maximum number of errors. The controller copies raw data stored in the failed page. The controller identifies locations of a first type of data cells that fail erase identification. The controller identifies locations of a second type of data cells that have program errors. The controller flips data values in the raw data at the locations of the first type of data cells and the locations of the second type of data cells. The controller is configured to perform error correcting code decoding on the raw data having flipped data values. The controller salvages data stored in the failed page.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
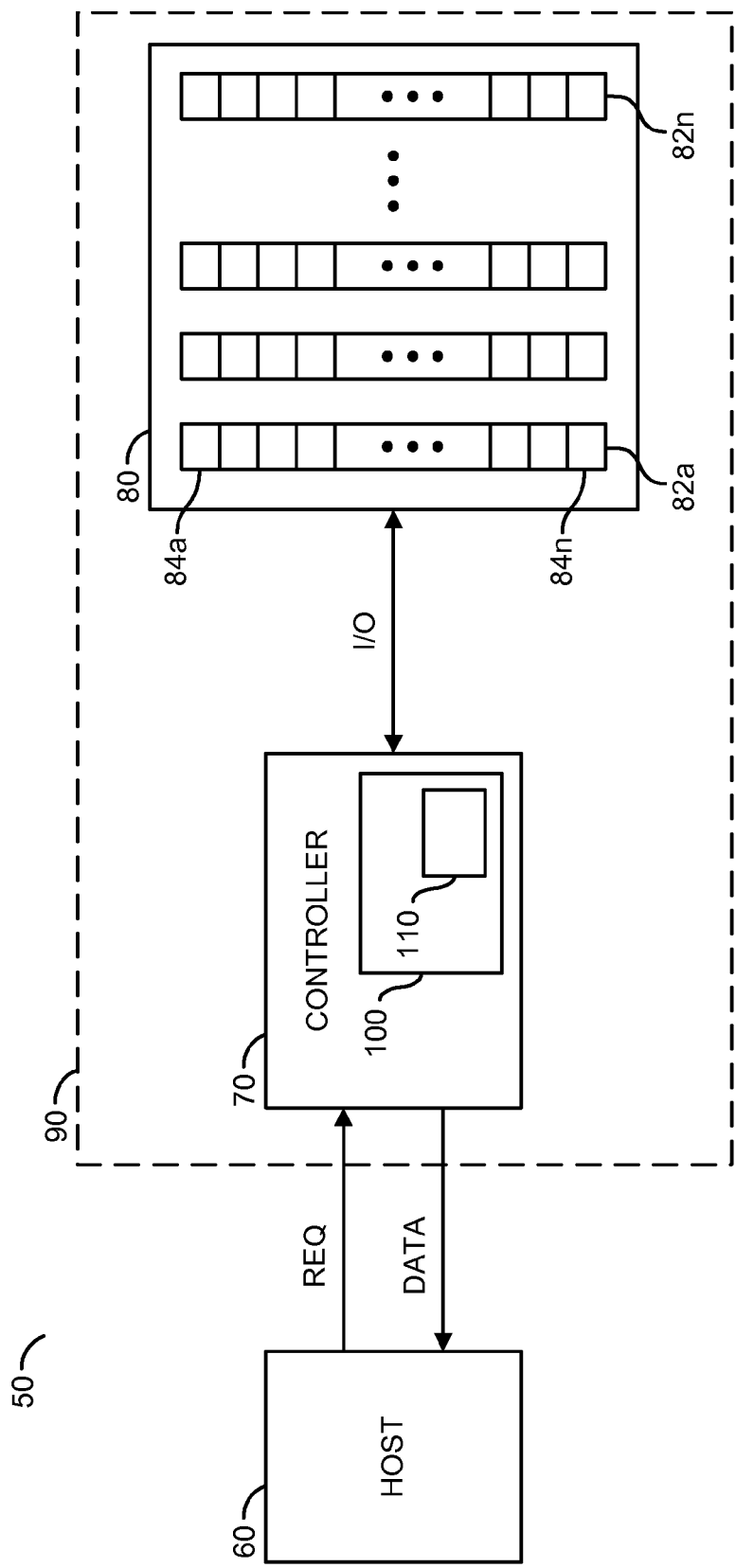
FIG. 1 is a diagram illustrating an example embodiment.

Embodiments of the invention include providing data recovery once ECC fails to correct the data that may (i) increase the probability of successful error correction code decoding, (ii) detect the location of memory cells that have program/erase cycling errors, (iii) exclude errors caused by transient errors, (iv) salvage important system data, (v) perform bit-fixing on cell locations that have hard errors, (vi) recover data that was previously unrecoverable, and/or (vii) be implemented as one or more integrated circuits.

The total errors of data in a codeword stored in flash memory may be classified into program/erase (P/E) cycling errors, cell-to-cell program interference errors, retention errors, and read disturb errors. The location of P/E cycling errors may have a strong correlation between successive P/E cycles. Using the correlation between P/E cycling errors and successive P/E cycles, the location of damaged flash cells may be identified. By knowing the location of damaged flash cells, erasure locations of read data due to damaged cells may be identified. Erasure-based decoding may be implemented to decode the data after flipping the data value in the damaged cell(s). Erasure-based decoding with flipped data values may improve the probability of successfully decoding the data that otherwise failed to be corrected by ECC.

NAND flash memory may have many different types of errors. The types of errors may be classified as hard errors (e.g., errors caused by permanent cell damage) or soft errors (e.g., transient errors). One example of a hard error in NAND flash memory is a P/E cycling error. A P/E cycling error may be caused by accumulated P/E cycles. NAND flash memory cells may start to fail at an increasingly high probability from P/E cycles once a cell fails for the first time. The number of cycles to first cell failure may be t1. After t1 cycles, the memory cell may fail quickly after another number of P/E cycles (e.g., t2 P/E cycles). Generally, the number of cycles t2 is less than the number of cycles t1.

An example of a transient error in NAND flash memory errors may be cell-to-cell program interference errors. Cell-to-cell program interference errors may be caused by programming neighboring cells (e.g., the programming of a cell may disturb nearby cells). Another example of a transient error in NAND flash memory may be retention errors. Retention errors may be cells that lose charge over time. Another example of a transient error in NAND flash memory may be read disturb errors. Read disturb errors may be caused by neighboring pages inside the same memory block being repeatedly read a certain number of times.

Generally, the total number of errors inside flash memory is approximately the sum of the four types of errors (e.g., P/E cycling errors, cell-to-cell program interference errors, retention errors, and/or read disturb errors). The total number of errors may be approximately modeled as:

$$\text{ERROR\_TOTAL} = \text{ERROR\_P/ECYCLING} + \text{ERROR\_CELL-TO-CELL} + \text{ERROR\_RETENTION} + \text{ERROR\_READDISTURB}$$

ECC may have an error correction capability. When the total number of flash memory errors ERROR_TOTAL exceeds the error correction capability of ECC, the ECC will fail to correct data stored in flash memory. In conventional flash memory systems, when ECC fails to correct the stored data, the data may be permanently lost. In one example, if the unrecoverable data is important system data (e.g., meta data, file system data, and/or a file index), the drive may be "bricked" (e.g., the drive may be rendered unusable).

The location(s) of errors caused by P/E cycling may have a strong correlation over continuous P/E cycles. The location(s) of flash memory cells may be identified even when ECC fails to correct the stored data. Bit-fixing may be implemented on the location of errors caused by P/E cycling damaged cells. For example, flipping data values may be bit-fixing. Bit-fixing may reduce the total number of errors. By reducing the total number of errors with bit-fixing, the total number of errors may be less than the error correction capability of the ECC. By reducing the total number of errors, the data that was previously unrecoverable maybe salvaged (e.g., the loss of important data may be prevented).

Embodiments of the invention may identify the flash cells damaged by P/E cycling after the stored data fails to be corrected by ECC. For example, the locations of cells with transient errors including retention errors, cell-to-cell program interference errors, and/or read disturb errors may be excluded. Embodiments of the invention may decode (e.g., correct) the stored data that has a total number of errors larger than the error correction capability threshold (e.g., T) of ECC by leveraging the location erasure information.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units, such as die, plane, block, and/or page units. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. A SLC type circuit generally stores a single bit per memory cell (e.g., a logical 0 or 1). In other embodiments, the circuit 80 may be implemented as a multi-level cell (e.g., MLC) type circuit. A MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111). In yet another embodiment, the circuit 80 may implement a circuit with a cell level greater than a triple-level cell. Generally, the circuit 80 may be implemented as a n-level cell capable of storing n-bits per memory cell.

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD 90 receives the host command REQ, in order to achieve the best performance, and/or to address wear leveling issues, the drive 90 will walk through all of the dies 82a-82n (e.g., a first page of DIE0, DIE1 . . . DIEn, then a next page of DIE0).

Figure 2:
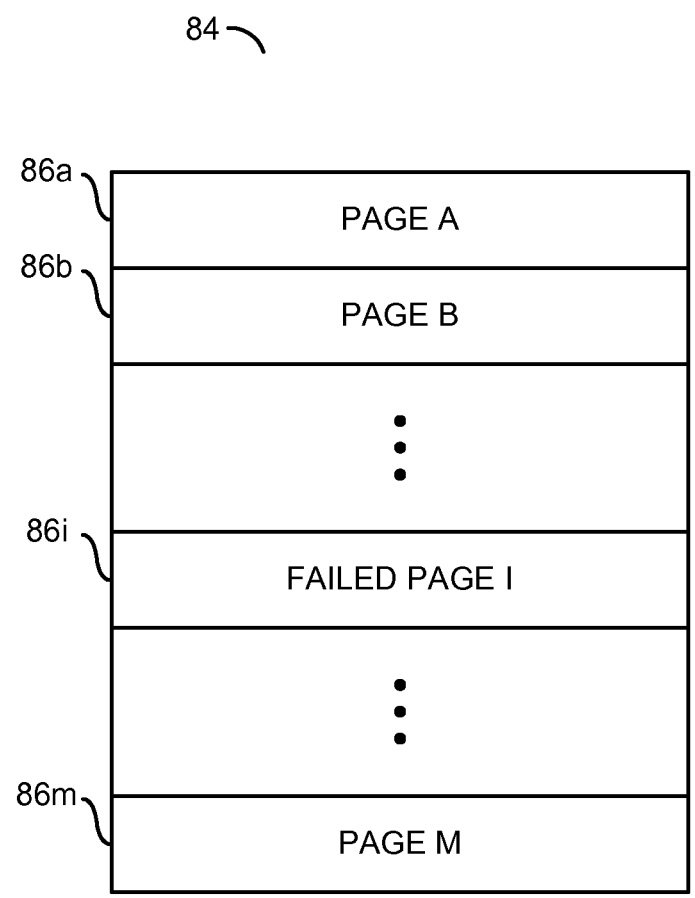
FIG. 2 is a diagram illustrating an example of a memory block containing a failed page.

Referring to FIG. 2, a diagram illustrating an example memory block containing a failed page 84 is shown. The memory block 84 may be an example of one of the memory blocks 84a-84n. The memory block 84 generally comprises blocks (or circuits) 86a-86m. The circuits 86a-86m may be pages. The pages 86a-86m are generally considered a smallest quantum of writing. The block 84 may be comprised of an integer number of the pages 86a-86m. Each of the pages 86a-86m may be comprised of an integer number of read units. A read unit (or codeword, or Epage, or ECC-page) is a smallest correctable quantum of reading and/or error correction.

The page 86i may be a failed page. The page 86i may be identified as a failed page because ECC has failed to decode the data in the page 86i. For example, the failed page 86i in the memory block 84 may fail to be corrected by ECC because the number of errors exceeds the error correction capability (e.g., the failed page 86*i* exceeds a maximum number of errors). For example, if ECC cannot converge the read data to a valid codeword, then ECC fails. Data recovery/salvage may be triggered when ECC fails. Generally, the controller 70 may not know the number of errors in the data in the failed page 86*i*. When ECC fails, the controller 70 may know that the number of errors in the failed page 86*i* is larger than the error correction capability of the ECC method. The data in the failed page 86*i* may be critical data. The critical data (e.g., meta data, file system data, and/or a file index) in the failed page 86*i* may need to be salvaged/recovered even when ECC fails.

Figure 3:
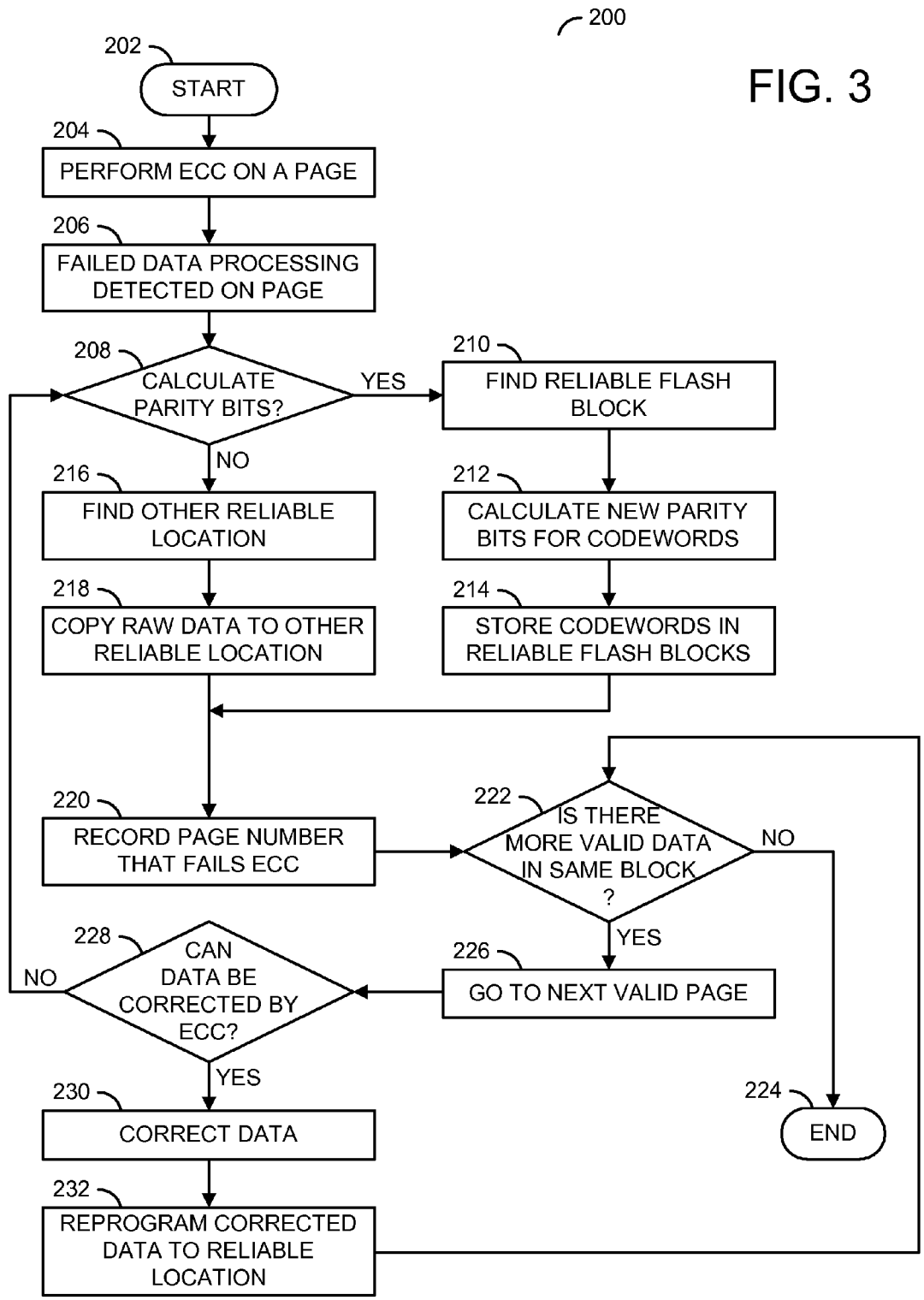
FIG. 3 is a flow diagram illustrating failed data processing.

Referring to FIG. 3, a flow diagram illustrating a method (or process) 200 is shown. The method 200 may implement failed data processing. The method 200 generally comprises a step (or state) 202, a step (or state) 204, a step (or state) 206, a decision step (or state) 208, a step (or state) 210, a step (or state) 212, a step (or state) 214, a step (or state) 216, a step (or state) 218, a step (or state) 220, a decision step (or state) 222, a step (or state) 224, a step (or state) 226, a decision step (or state) 228, a step (or state) 230, and a step (or state) 232.

The state 202 may start the method 200. Next, the state 204 may perform ECC on a page (e.g., on the failed page 86*i*). Next, the state 206 may detect failed data processing in the page (e.g., in the failed page 86*i*). For example, the data in the failed page 86*i* may fail because the number of errors in the page exceeds the maximum number of errors ECC is capable of correcting. The controller 70 may track errors and/or be capable of detecting the number of errors in a memory block and/or page. The controller 70 may be capable of detecting whether the number of errors in a memory location is above the error correcting capability threshold of the ECC method. Next, the method 200 moves to the decision state 208.

The decision state 208 may determine whether to calculate parity bits. If so, the method 200 moves to the state 210. The state 210 finds a reliable flash block (or blocks). The reliable flash block may be another one of the flash blocks 84*a*-84*n* that is known to be reliable. The controller 70 may be configured to track the location of memory blocks that are known to be reliable. For example, the reliable flash block may be a flash block in a different one of the memory dies 82*a*-82*n*. In another example, the reliable flash memory block may be in the same memory die. Next, the method 200 moves to the state 212. The state 212 may calculate new parity bits for the codewords. Next, the state 214 may store the codewords in the reliable flash block(s). Next, the method 200 moves to the state 220.

If the decision state 208 determines not to calculate parity bits, the method 200 moves to the state 216. The state 216 may find another reliable location (e.g., some buffers and/or caches). Next, the state 218 may copy the raw data from the failed page to the other reliable location. Next the method 200 moves to the state 220.

The state 220 records the page number that fails ECC. Next, the method 200 moves to the decision state 222. The decision state 222 may determine whether there is more valid data in the same block. If not, the method 200 moves to the state 224, which ends the method 200. If so, the method 200 moves to the state 226. The state 226 may go to the next valid page in the memory block. Next, the method 200 moves to the decision state 228.

The decision state 228 may determine whether the data can be corrected by ECC. If not, the method 200 returns to the decision state 208. If so, the method 200 moves to the state 230. The state 230 may correct the data. The data may be corrected by ECC. Next, the state 232 may reprogram the corrected data to a reliable location (e.g., a memory block known to be reliable, buffers, and/or cache). Next, the method 200 returns to the decision state 222.

The method 200 may be the first part of the data recovery performed by the controller 70. For example, the failed page 86*i* may fail data processing. The controller 70 may determine the number of errors in the failed page 86*i* is larger than the error correction capability of the ECC. Raw data from the failed page 86*i* may be copied to another location. In one example, the raw data from the failed page 86*i* may be moved to some other reliable locations that do not need parity bits for protection (e.g., some buffers and/or caches). In another example, new parity bits may be calculated to form a codeword to protect the raw data. The newly generated codewords may be stored in other flash blocks that are known to be reliable (e.g., the flash memory blocks 84*a*-84*n* in the same memory die and/or the flash memory blocks 84*a*-84*n* in a different one of the memory dies 82*a*-82*n*). Blocks that are known to be reliable may be tracked by the controller 70. For example, the controller 70 may track memory blocks that have passed ECC in a usable block list (e.g., a list of usable locations). The page number and/or location of the page that fails ECC may be recorded (e.g., the location of the failed page 86*i*).

In one embodiment, the controller 70 may process other valid data sharing the same memory block with the failed page. In an example where the memory block 84 contains the failed page 86*i*, the controller 70 may process the other memory pages 86*a*-86*m* in the memory block 84. The data in the pages 86*a*-86*m* may be read page by page. In one example, if the data in the pages 86*a*-86*m* can be corrected by ECC decoding, the data may be corrected. The corrected data may be reprogrammed to other reliable locations (e.g., other memory blocks that are known to be reliable). In another example where the data fails to be corrected by ECC decoding, the raw data may be copied to other reliable locations (e.g. some buffers and/or caches) before ECC decoding. In yet another example, if the data fails to be corrected by ECC decoding, new parity bits may be calculated to form a codeword to protect the raw data in the memory page. The newly generated codewords may be stored in other flash memory blocks that are known to be reliable. The page number and/or location of the page(s) that fail(s) ECC may be recorded (e.g., the location of the failed page 86*i*).

Figure 4:
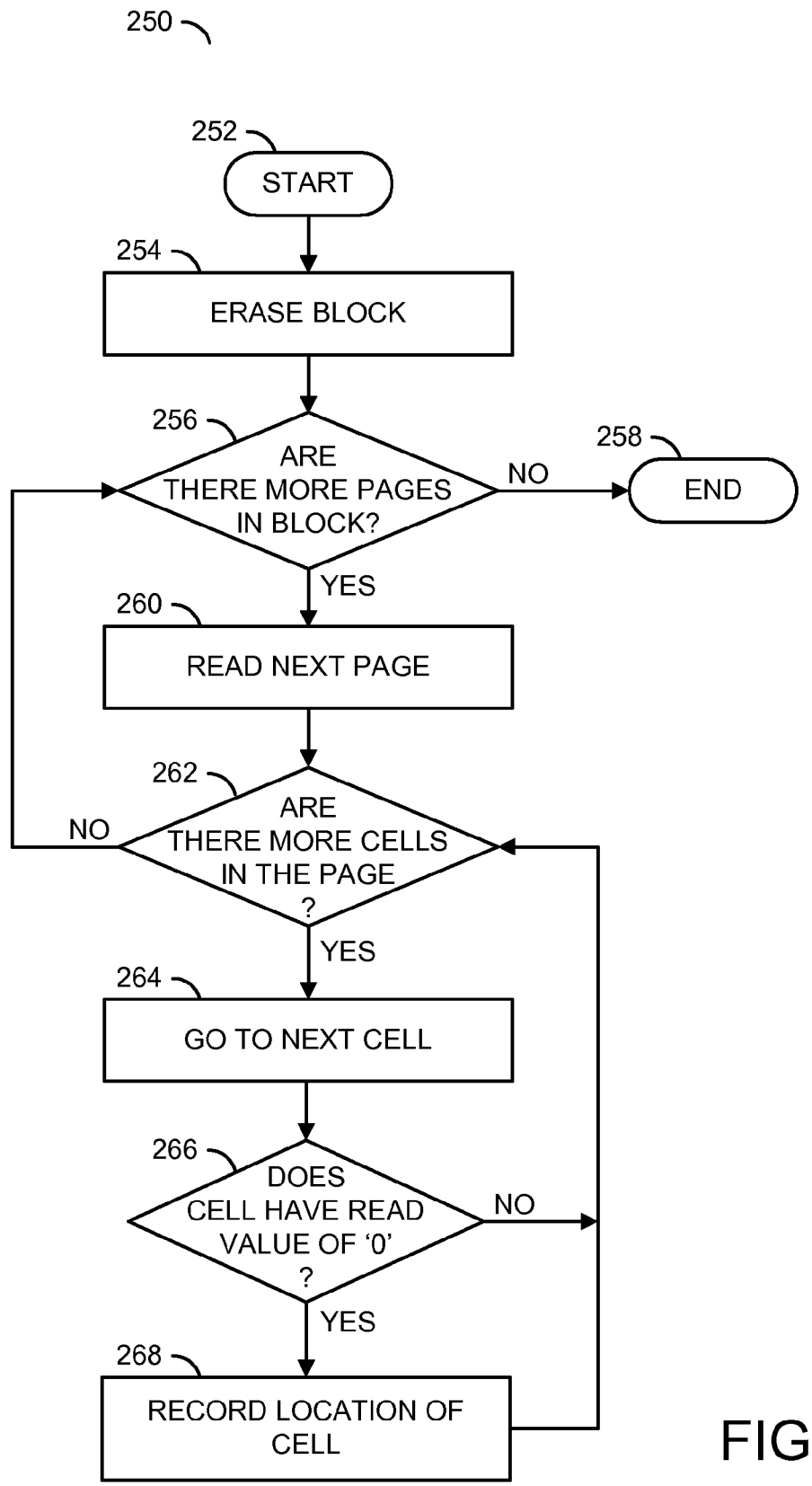
FIG. 4 is a flow diagram illustrating identifying cells that fail erase identification.

Referring to FIG. 4, a flow diagram illustrating a method (or process) 250 is shown. The method 250 may identify cells that fail erase identification. The method 250 generally comprises a step (or state) 252, a step (or state) 254, a decision step (or state) 256, a step (or state) 258, a step (or state) 260, a decision step (or state) 262, a step (or state) 264, a decision step (or state) 266, and a step (or state) 268.

The state 252 may start the method 250. Next, the state 254 may erase the memory block. Next, the method 200 moves to the decision state 256. The decision state 256 may determine whether there are more pages in the memory block. If riot, the method 250 moves to the state 258, which ends the method 250. If so, the method 250 moves to the state 260. The state 260 reads the next page in the memory block. Next, the method 250 moves to the decision state 262.

The decision state 262 may determine whether there are more cells in the page. If not, the method 250 returns to the decision state 256. If so, the method 250 moves to the state 264. The state 264 may go to the next cell. Next, the method 250 moves to the decision state 266. The decision state 266 may determine whether the cell has a read value of 0. A read value of logical 0 instead of logical 1 may indicate the cell failed to be erased. If the decision state 262 determines the cell does not have a read value of logical 0, the method 250 returns to the decision state 262. If the decision state 262 determines the cell does have a read value of logical 0, the method 250 moves to the state 268. The state 268 may record the location of the cell (e.g., the cell that failed to be erased). Next, the method 250 returns to the decision state 262.

The method 250 may identify cells that fail erase identification as a second part of the data recovery performed by the controller 70. Cells in the failed data page (e.g., the failed page 86i) may fail erase identification. The cells that fail erase identification may be located by erasing the memory block (e.g., the memory block 84), and reading the failed page (e.g., the failed page 86i). Since the failed data processing method 200 has already copied the data in the failed page, the data in the failed page may be erased without losing the stored data. A cell that fails to be erased may have a read value of logical 0 instead of logical 1. The location of the cell(s) that failed to be erased in the failed page may be recorded. For example, the cells that fail erase identification may be a first type of cell with permanent P/E cycling damage.

Figure 5:
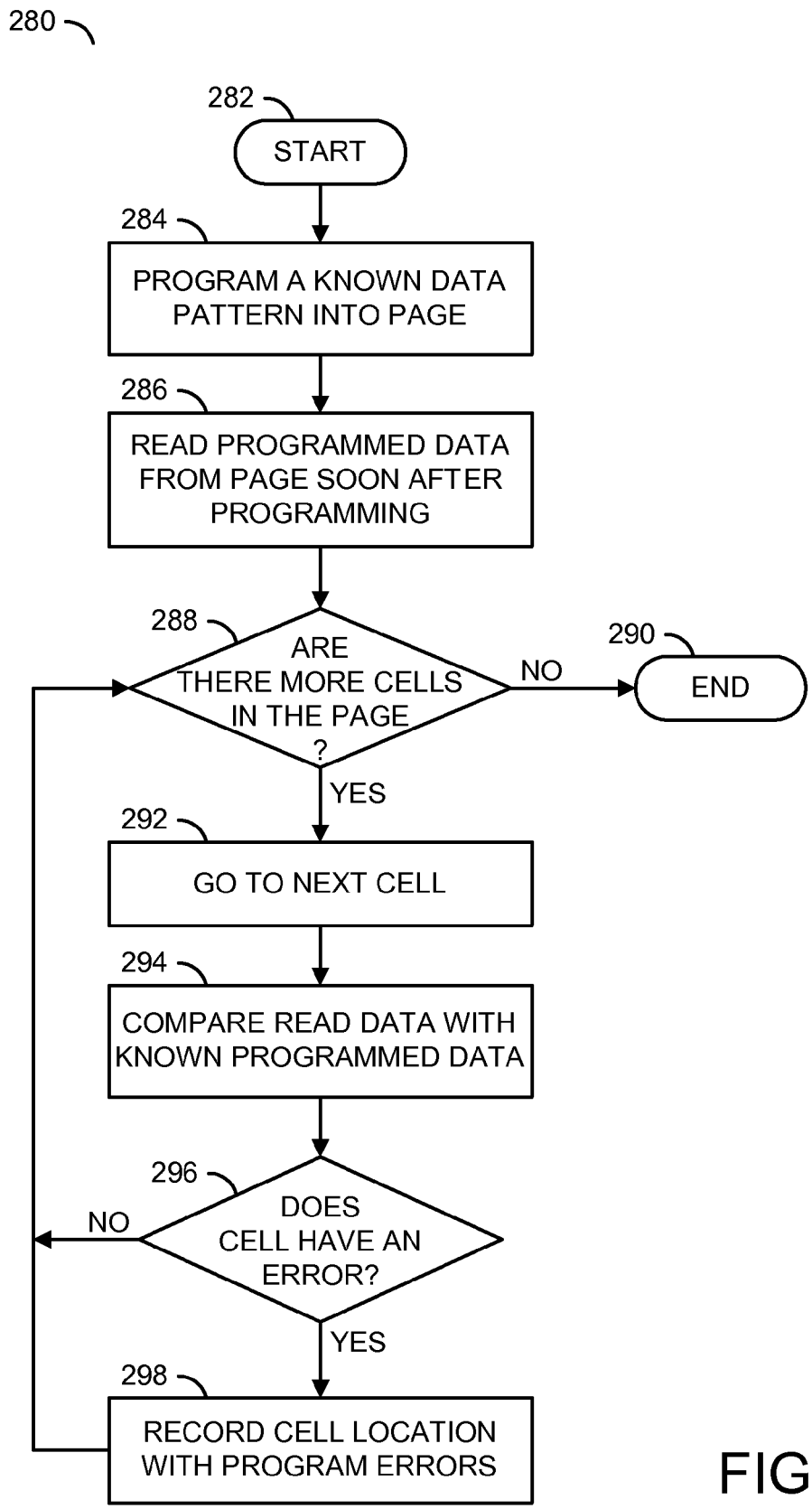
FIG. 5 is a flow diagram illustrating identifying cells that fail program identification.

Referring to FIG. 5, a flow diagram illustrating a method (or process) 280 is shown. The method 280 may implement identifying cells that fail program identification. The method 280 generally comprises a step (or state) 282, a step (or state) 284, a step (or state) 286, a decision step (or state) 288, a step (or state) 290, a step (or state) 292, a step (or state) 294, a decision step (or state) 296, and a step (or state) 298.

The state 282 may start the method 280. Next, the state 284 may program a known data pattern into a page (e.g., one of the pages 86a-86m). Next, the state 286 may read programmed data from the page soon after programming. Next, the method 280 moves to the decision state 288.

The decision state 288 may determine whether there are more cells in the page. If not, the method 280 moves to the state 290, which ends the method 280. If so, the method 280 moves to the state 292. The state 292 goes to the next cell. Next, the state 294 compares the read data with the known programmed data. Next, the method 280 moves to the decision state 296.

The decision state 296 determines whether the cell has an error. If not, the method 280 returns to the decision state 288. If so, the method 280 moves to the state 298. The state 298 records the cell location with program errors. Next, the method 280 returns to the decision state 288.

The method 280 may identify cells that fail program identification as a third part of the data recovery performed by the controller 70. Cells in the failed data page (e.g., the failed page 86i) may fail program identification. The cells that fail program identification may be located by programming a known data pattern in the failed page (e.g., the failed page 86i), reading the programmed known data pattern from the failed page 86i soon after programming the known data pattern, and comparing the read known data pattern from the failed page 86i with the known data pattern that was programmed. Since the failed data processing method 200 has already copied the data in the failed page, the data in the failed page may be programmed without losing the stored data.

The cell locations with program errors may be identified by comparing the read data pattern from the failed page with the known data pattern. A cell that fails to be programmed may have a read value of logical 1 instead of logical 0. The location of the cell(s) that failed to be programmed in the failed page 86i may be recorded. For example, the cells that fail program identification may be a second type of cell with permanent P/E cycling damage.

During the method 280, the neighboring wordlines of the failed page (e.g., the failed page 86i) may not be programmed. Not programming the neighboring wordlines of the failed page 86i may exclude cell-to-cell program interference (e.g., one of the types of soft transient errors). During the method 280, the reading of the known data pattern may be performed soon after the data is programmed. Reading the known data pattern soon after the data is programmed may exclude retention errors (e.g., another one of the types of soft transient errors). During the method 280, reads are not performed on other pages in the memory block 84. Not reading other pages in the memory block 84 may exclude read disturb errors (e.g., another one of the types of soft transient errors).

By excluding cell-to-cell program interference, retention errors, and read disturb errors, the three types of transient errors that may be part of the total number of flash memory errors, ERROR_TOTAL are excluded. By excluding the three types of transient errors from the total number of flash memory errors (e.g., the value ERROR_TOTAL), ERROR_TOTAL may be approximately equal to the number of hard errors caused by P/E cycling. Together, the method 250 identifying cells that fail erase identification, and the method 280 identifying cells that fail program identification may identify and record the location(s) of the cells with permanent P/E cycling damage. For example, the cells that fail erase identification may be one type of cell with permanent P/E cycling damage, and the cells that fail program identification may be another type of cell with permanent P/E cycling damage.

Figure 6:
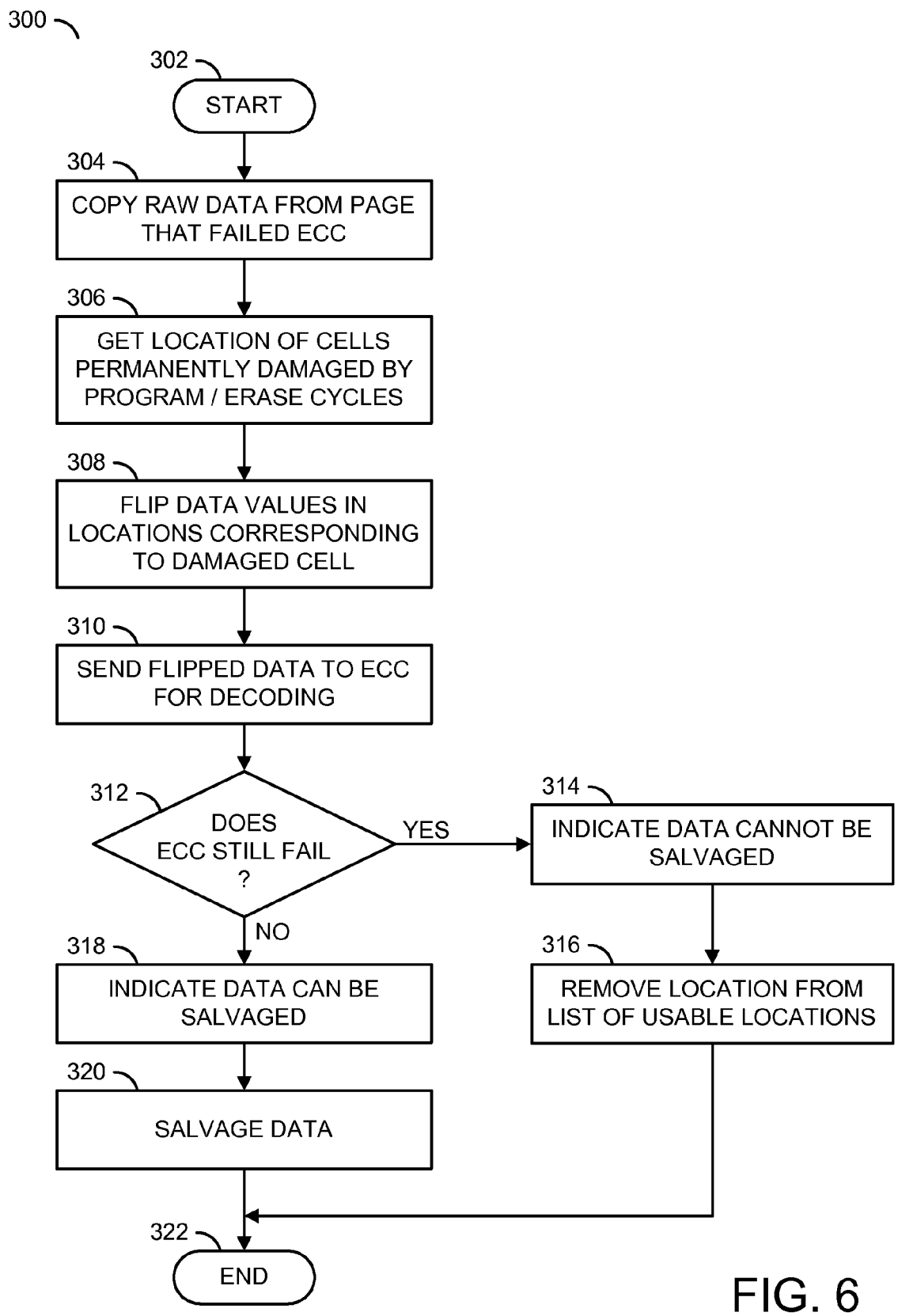
FIG. 6 is a flow diagram illustrating salvaging data from damaged cells.

Referring to FIG. 6, a flow diagram illustrating a method (or process) 300 is shown. The method 300 may implement salvaging data from damaged cells. The method 300 generally comprises a step (or state) 302, a step (or state) 304, a step (or state) 306, a step (or state) 308, a step (or state) 310, a decision step (or state) 312, a step (or state) 314, a step (or state) 316, a step (or state) 318, a step (or state) 320, and a step (or state) 322.

The state 302 may start the method 300. Next, the state 304 copies raw data from the page that failed ECC (e.g., the copy of the raw data from the method 200 described in FIG. 3). The state 306 may get the location of cells permanently damaged by program/erase cycles (e.g., the locations from the method 250 described in FIG. 4 and/or from the method 280 described in FIG. 5). Next, the state 308 flips data values in the locations corresponding to a damaged cell. The state 310 sends flipped data to ECC for decoding. Next, the method 300 moves to the decision state 312.

If the decision state 312 determines that ECC still fails, the method 300 moves to the state 314. The state 314 indicates the data cannot be salvaged. Next, the state 316 removes the location from the list of usable locations. Next, the method 300 moves to the state 322, which ends the method 300. If the decision state 312 determines that ECC does not still fail, the method 300 moves to the state 318. The state 318 indicates the data can be salvaged. Next, the state 320 may salvage the data. Next, the method 300 moves to the state 322, which ends the method 300.

The method 300 implementing salvaging data from damaged cells may be the fourth part of the data recovery performed by the controller 70. The data stored in a failed page (e.g., the failed page 86i) may be salvageable/recoverable. The data in the failed page 86i may be salvaged by retrieving the copy of the raw data in the failed page 86i, retrieving the location(s) of the cells that are permanently damaged by P/E cycles, flipping the data values of the raw data in the location(s) corresponding to the damaged cell(s), and sending the flipped data (e.g., the raw data with flipped data values) to ECC for decoding.

The copy of the raw data in the failed page 86i may be stored in a location that is known to be reliable as described in the failed data processing method 200. The location(s) of the cells that are permanently damaged by P/E cycles may be known from the method 250 identifying cells that fail erase identification, and/or the method 280 identifying cells that fail program identification. Flipping the data values in the location(s) corresponding to the damaged cell(s) may be bit-fixing. For example, a cell that fails to be erased may have a read value of logical 0 instead of logical 1. Since the error is known, the data value may then be flipped from a logical 0 to a logical 1. In another example, a cell that fails to be programmed may have a read value of logical 1 instead of logical 0. Since the error is known, the data value may then be flipped from a logical 1 to a logical 0. Bit-fixing may reduce the total number of hard errors caused by P/E cycling.

By reducing the total number of hard errors caused by P/E cycling the total number of errors, the value ERROR_TOTAL is reduced. If the total number of errors after bit-fixing the data in damaged cells are below the maximum error correction capability threshold T of the ECC method, the data stored in the failed page may be salvaged. Generally, if ECC can correct the errors the number of errors in the data is known. If the data cannot be salvaged, the controller 70 may remove the memory location from a list of usable blocks. For example, the controller 70 may ignore the unsalvageable memory location (e.g., not use the memory location to store data). Generally, successfully salvaging data occurs when the failed page first fails to be corrected by ECC. Generally, when the failed page first fails to be corrected by ECC the total number of errors are slightly above the ECC error correction capability threshold T.

For example, the ECC decoding method may correct T errors (e.g, the error correction capability threshold T). If the identified number cells with P/E cycling errors is N (e.g., N erasures is the sum of the number of cells that failed erase identification and the number of cells that failed program identification), then the ECC decoding method may be capable of correcting up to t+N errors. By increasing the error correction capability of the ECC decoding method, the probability that the data stored in the failed page may be corrected is increased. Increasing the probability of recovering data stored in the failed page is especially important when the data stored is important data such as meta data.

Figure 7:
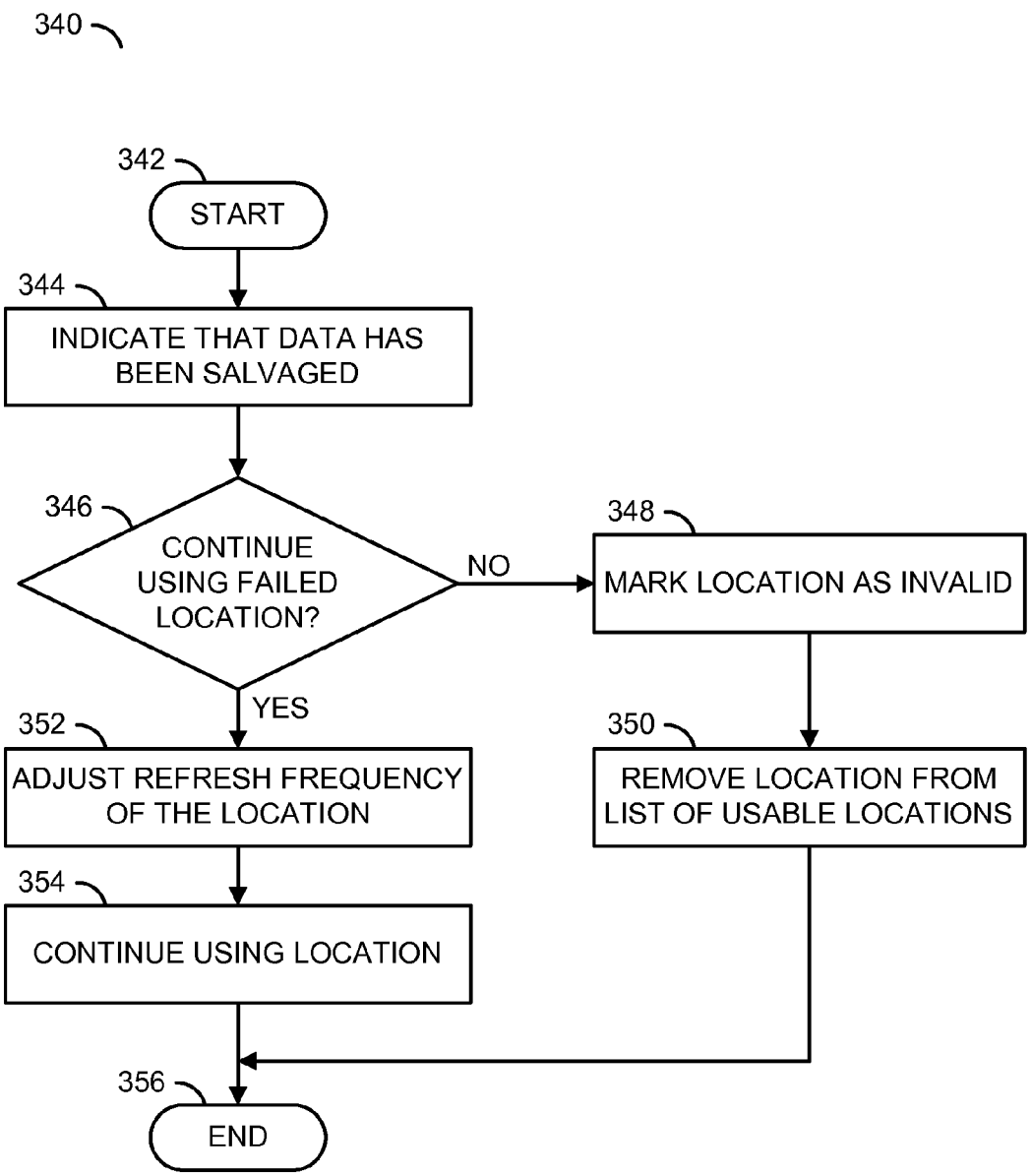
FIG. 7 is a flow diagram illustrating determining the use of a memory block after data has been salvaged.

Referring to FIG. 7, a flow diagram illustrating a method (or process) 340 is shown. The method 340 may implement determining the use of a memory block after data has been salvaged. The method 340 generally comprises a step (or state) 342, a step (or state) 344, a decision step (or state) 346, a step (or state) 348, a step (or state) 350, a step (or state) 352, a step (or state) 354, and a step (or state) 356. The state 342 may start the method 340. Next, the state 344 may indicate that data has been salvaged. Next, the method 340 may move to the decision state 346.

If the decision state 346 determines not to continue using the failed location, the method 340 moves to the state 348. The state 348 may mark the location as invalid. Next, the state 350 may remove the location from the list of usable locations. Next, the method 340 moves to the state 356, which ends the method 340. If the decision state 346 determines to continue using the failed location, the method 340 moves to the state 352. The state 352 may adjust the refresh frequency of the location. Next, the state 354 may continue using the location. Next, the method 340 moves to the state 356, which ends the method 340.

After the data has been recovered/salvaged the memory block (e.g., the memory block 84) and/or the page (e.g., the failed page 86i) that fail to be corrected may be marked as invalid. In one example, an invalid block may be removed from a list of usable blocks. For example, the controller 70 may keep track of a list of the locations of usable memory blocks and/or unusable memory blocks. In one example, the usable memory blocks may be one of the known reliable locations. In another example, the unusable memory blocks may be ignored (e.g., not used to store data). In yet another example, the memory block that failed to be corrected may still be considered usable. However, the frequency that the memory block is refreshed may be adjusted (e.g., refreshed more frequently than before the failure was detected) to control the total number of errors in the memory block. Adjusting the refresh frequency of the memory block may keep the total number of errors in the memory block below the error correction capability of the ECC decoding method.

Figure 8:
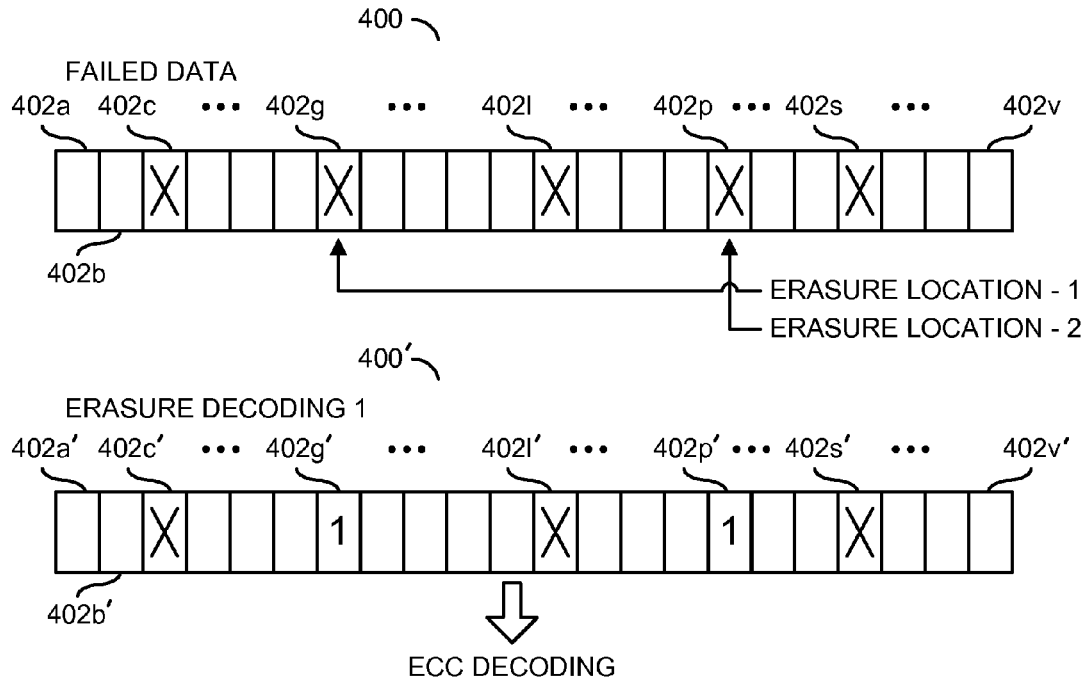
FIG. 8 is a diagram illustrating an example of erasure decoding with flipped data values for cells that fail erase identification.

Referring to FIG. 8, a diagram illustrating an example of erasure decoding with flipped data values for cells that fail erase identification is shown. The block 400 may be a memory page (e.g., one of the memory pages 86a-86m) with failed data. The memory page 400 may contain the cells 402a-402v. Some of the cells 402a-402v may have errors. For example, the cells 402c, 402g, 402l, 402p, and 402s are shown having errors (e.g., the cells marked with an X). The errors may be hard errors and/or transient errors. The method 250 (described in association with FIG. 4) may identify the locations of cells that fail erase identification. The cells 402g (e.g., erasure location-1) and 402p (e.g., erasure location-2) may be the cells that failed erase identification. Cells that fail erase identification may have a logical value of 0 instead of 1.

The block 400' may be the memory page 400 after erasure decoding. Erasure decoding may flip the data values in the cell locations that failed erase identification. Since the cell locations that failed erase identification have a known error, the data may be flipped before being sent to ECC decoding. For example, the cell 402g' and the cell 402p' corresponding to the locations that failed erase identification may have a flipped data value. The flipped data value may be a bit-fixed logical value of 1. The other cells that may have transient errors, (e.g., the cells 402c', 402l', and 402s') may not have flipped data values. Flipping the data may increase the error correction capability threshold of the ECC method. Increasing the error correction capability threshold may increase the probability of successfully salvaging the data. For example, cells that fail erase identification may be flipped to a logical value of 1. The data in the memory page 400' may be sent to ECC for decoding.

Figure 9:
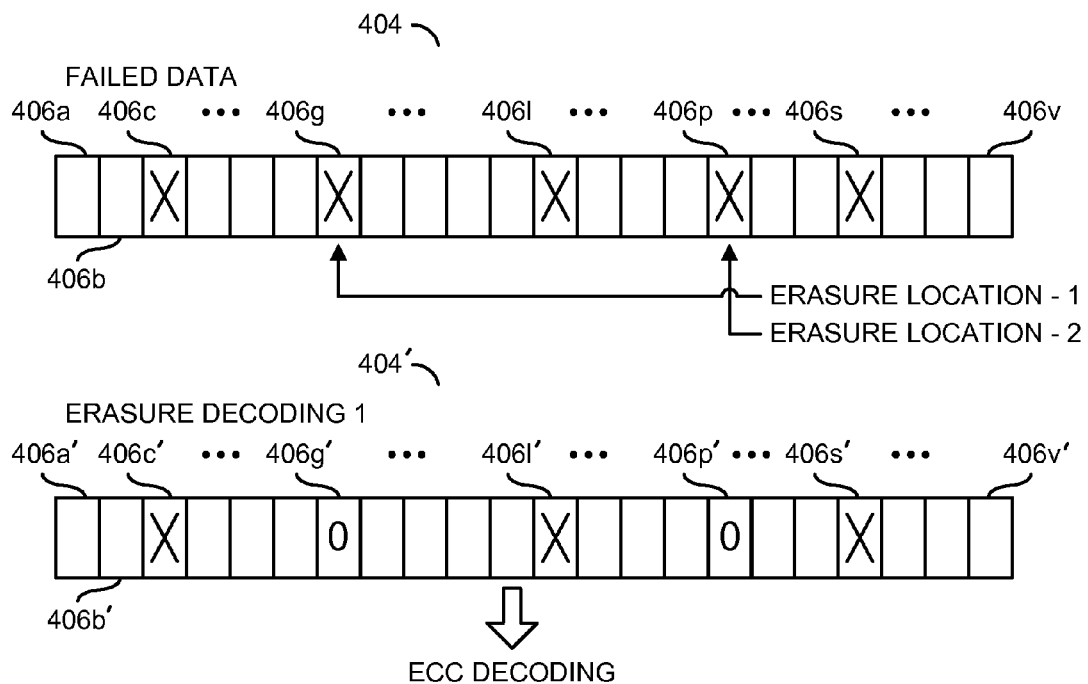
FIG. 9 is a diagram illustrating an example of erasure decoding with flipped data values for cells that fail program identification.

Referring to FIG. 9, a diagram illustrating an example of erasure decoding with flipped data values for cells that fail program identification is shown. The block 404 may be a memory page (e.g., one of the memory pages 86a-86m) with failed data. The memory page 404 may contain the cells 406a-406v. Some of the cells 406a-406v may have errors. For example, the cells 406c, 406g, 406l, 406p, and 406s are shown having errors (e.g., the cells marked with an X). The errors may be hard errors and/or transient errors. The method 280 (described in association with FIG. 5) may identify the locations of cells that fail program identification. The cells 406g (e.g., erasure location-1) and 406p (e.g., erasure location-2) may be the cells that failed program identification. Cells that fail program identification may have a logical value of 1 instead of 0.

The block 404' may be the memory page 404 after erasure decoding. Erasure decoding may flip the data values in the cell locations that failed program identification. Since the cell locations that failed program identification have a known error, the data may be flipped before being sent to ECC decoding. For example, the cell 406g' and the cell 406p' corresponding to the locations that failed program identification may have a flipped data value. The flipped data value may be a bit-fixed logical value of 0. The other cells that may have transient errors, (e.g., the cells 406c', 406l', and 406s') may not have flipped data values. Flipping the data may increase the error correction capability threshold of the ECC method. Increasing the error correction capability threshold may increase the probability of successfully salvaging the data. For example, cells that fail program identification may be flipped to a logical value of 0. The data in the memory page 404' may be sent to ECC for decoding.

Hard errors in NAND flash memory may be errors caused by permanent cell damage. Generally, once a P/E cycling error is present the error will happen again in the following P/E cycles. Generally, a hard error is unrecoverable. Soft errors (e.g., transient errors) in NAND flash memory may be caused by retention errors, cell-to-cell program interference errors, and/or read disturb error. Transient errors may not be caused by permanent cell damage. When the total number of cells with errors (e.g., both soft errors and hard errors) exceeds the error correction capability of ECC, ECC may fail. In one example, if the number of P/E cycle errors can be reduced, the total number of errors may be reduced. By identifying the P/E cycle error locations, the total number of errors may be reduced. If the total number of errors is reduced, then ECC may be successful in decoding data that would have otherwise failed ECC. With successful ECC decoding the data stored in the memory page may be salvaged/recovered.

The functions performed by the diagrams of FIGS. 3-7 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a memory configured to store data, the memory comprising a plurality of memory modules each having a size less than a total size of the memory; and
   a controller configured to (A) process a plurality of read/write operations and (B) salvage data stored in a failed page of the memory determined to exceed a maximum number of errors, wherein the controller (i) copies raw data stored in the failed page, (ii) identifies locations of a first type of data cells that fails erase identification, (iii) identifies locations of a second type of data cells that has program errors, (iv) flips data values in the raw data at the locations of the first type of data cells and the locations of the second type of data cells, (v) performs error correcting code decoding on the raw data having flipped data values, and (vi) salvages data stored in the failed page.

2. The apparatus according to claim 1, wherein the first type of data cells and the second type of data cells have permanent cell damage.

3. The apparatus according to claim 2, wherein the permanent cell damage is caused by program/erase cycling.

4. The apparatus according to claim 1, wherein the maximum number of errors is a value above an error correcting capability threshold of the error correcting code.

5. The apparatus according to claim 1, wherein a number of errors in the data after salvaging the data is a value below an error correcting capability threshold of the error correcting code.

6. The apparatus according to claim 1, wherein the flipped data increases a probability that the data stored in the failed page of the memory will be salvaged.

7. The apparatus according to claim 1, wherein the identification of the locations of the first type of data cells and the identification of the locations of the second type of data cells excludes data cells in the failed page of the memory that have transient errors.

8. The apparatus according to claim 1, wherein a block of the memory containing the failed page is marked as invalid after the data in the failed page is salvaged.

9. The apparatus according to claim 1, wherein a refresh frequency of a block of the memory containing the failed page is increased after the data in the failed page is salvaged.

10. The apparatus according to claim 1, wherein a block of the memory containing the failed page is marked as invalid if the data in the failed page cannot be salvaged.

11. The apparatus according to claim 1, wherein the controller is further configured to track a location of memory blocks of the memory that are known to be reliable.

12. The apparatus according to claim 11, wherein the raw data stored in the failed page is copied to the memory blocks of the memory that are known to be reliable.

13. The apparatus according to claim 12, wherein new parity bits are calculated to protect the raw data copied to the memory blocks of the memory that are known to be reliable.

14. The apparatus according to claim 1, wherein the raw data stored in the failed page is copied to (A) buffers in a first mode and (B) cache in a second mode.

15. The apparatus according to claim 1, wherein the errors are correctable errors.

16. The apparatus according to claim 1, wherein other pages stored in a memory block containing the failed page are read and (i) are corrected by error correcting code decoding, and (ii) copied to a known reliable location of the memory if the other pages fail error correcting code decoding.

17. The apparatus according to claim 1, wherein the locations of the first type of data cells are identified by (i) erasing a block of the memory containing the failed page, (ii) reading the failed page, and (iii) recording locations of cells with a read value of logical 0.

18. The apparatus according to claim 1, wherein the locations of the second type of data cells are identified by (i) programming a known data pattern into the failed page, (ii) reading a data pattern from the failed page, (iii) comparing the data pattern read from the failed page with the known data pattern, and (iv) recording locations of cells in the failed page that do not match the known data pattern.

19. An apparatus comprising:
an interface configured to process a plurality of read/write operations to/from a memory; and
a control circuit configured to salvage data stored in a failed page of the memory determined to exceed a maximum number of errors, wherein the control circuit (i) copies raw data stored in the failed page, (ii) identifies locations of a first type of data cells that fails erase identification, (iii) identifies locations of a second type of data cells that has program errors, (iv) flips data values in the raw data at the locations of the first type of data cells and the locations of the second type of data cells, (v) performs error correcting code decoding on the raw data having flipped data values, and (vi) salvages data stored in the failed page.

20. A method for salvaging data in a flash memory, comprising:
copying raw data stored in a failed page of the flash memory;
identifying locations of a first type of data cells, wherein the first type of data cells fails erase identification;
identifying locations of a second type of data cells, wherein the second type of data cells has program errors;
flipping data values in the raw data at the locations of the first type of data cells and the locations of the second type of data cells; and
salvaging data stored in the failed page.

* * * * *